United States Patent [19]

Akazawa et al.

[11] Patent Number: 4,542,350
[45] Date of Patent: Sep. 17, 1985

[54] MONOLITHIC INTEGRATED CIRCUIT DEVICE INCLUDING AC NEGATIVE FEEDBACK TYPE HIGH FREQUENCY AMPLIFIER CIRCUIT

[75] Inventors: Yukio Akazawa, Atsugi; Noboru Ishihara, Zama; Mamoru Ohara, Atsugi, all of Japan

[73] Assignee: Nippon Telegraph & Telephone Public Corporation, Tokyo, Japan

[21] Appl. No.: 515,280

[22] Filed: Jul. 19, 1983

[30] Foreign Application Priority Data

Jul. 19, 1982 [JP] Japan ............................... 57-125366
Aug. 9, 1982 [JP] Japan ............................... 57-137195
Aug. 16, 1982 [JP] Japan ............................... 57-141984

[51] Int. Cl.$^4$ ........................... H03F 1/34; H03G 3/12
[52] U.S. Cl. ..................................... 330/293; 330/283
[58] Field of Search ............... 330/278, 279, 285, 283, 330/293

[56] References Cited

FOREIGN PATENT DOCUMENTS 838731 6/1960 United Kingdom ............... 330/283

OTHER PUBLICATIONS

Session VII Microwave Analog and Digital Signal Processors, by Walter Krupa et al., ISSCC 78/Wednesday, Feb. 15, 1978, Continental Ballroom.

Primary Examiner—James B. Mullins
Assistant Examiner—G. Wan
Attorney, Agent, or Firm—Blakely, Sokoloff, Taylor & Zafman

[57] ABSTRACT

A monolithic integrated circuit device is formed on a substrate and made up of an AC negative feedback circuit for a high frequency amplifier circuit. The AC negative feedback circuit includes a semiconductor impedance element and connected to an external terminal on the substrate, and variable control means for adjusting an amount of the AC feedback of the high frequency amplifier circuit. As the semiconductor impedance element is used the junction capacitance of a diode under negative bias, diffusion capacitance between the base and emitter electrodes or between the base and collector electrodes of a transistor or a differentiated resistance of a diode.

26 Claims, 34 Drawing Figures

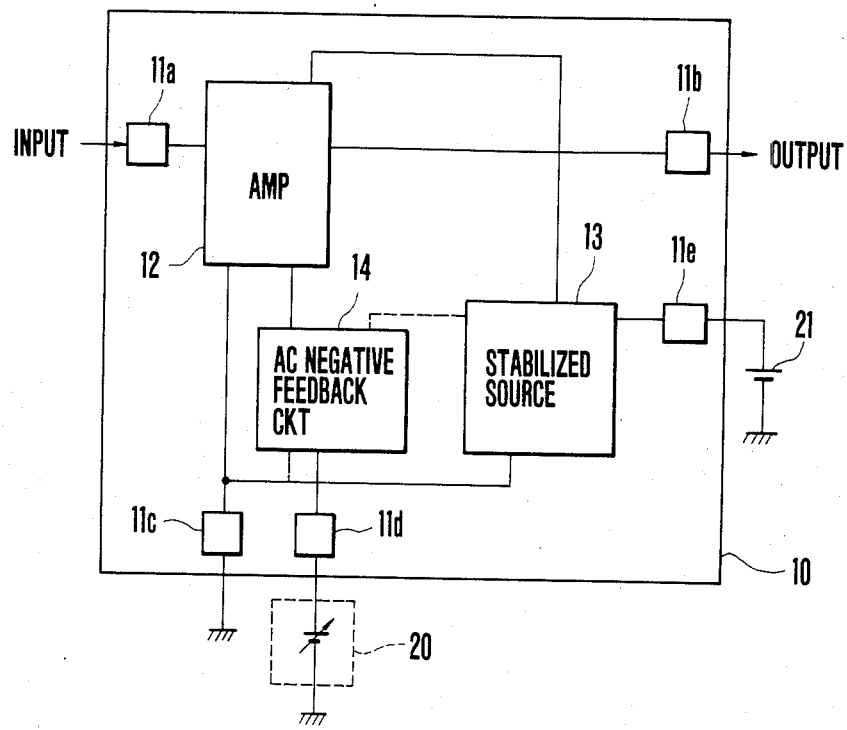
F I G. 1
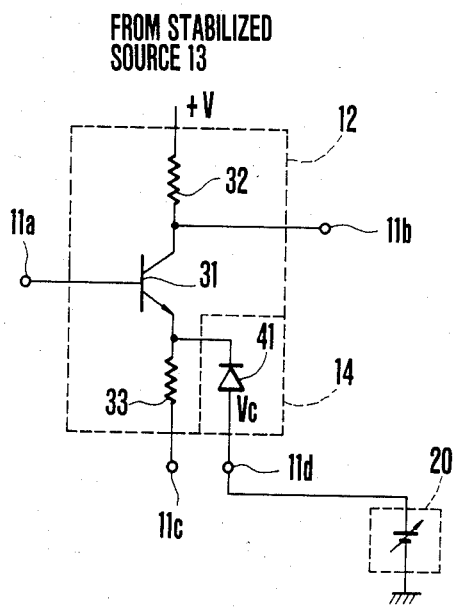
F I G. 2

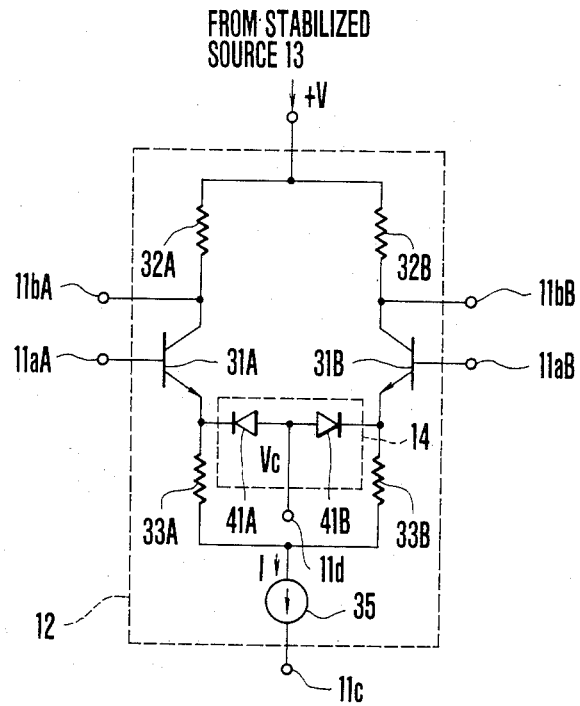
F I G.5
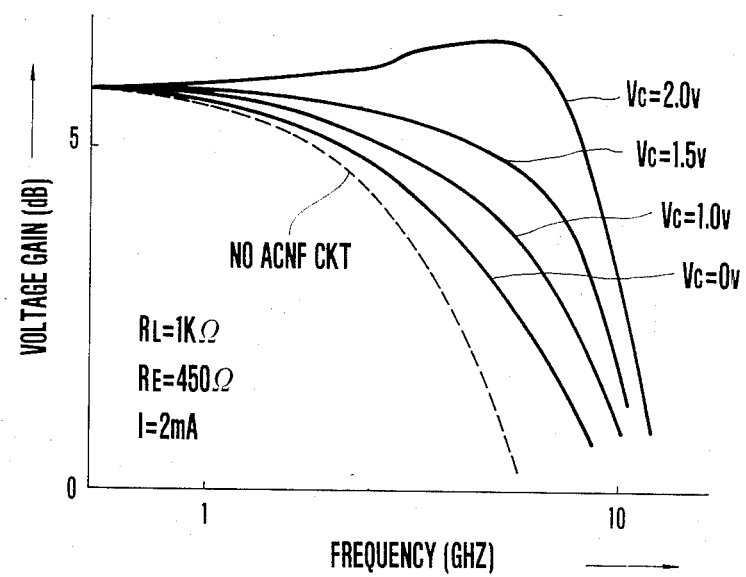
F I G.6

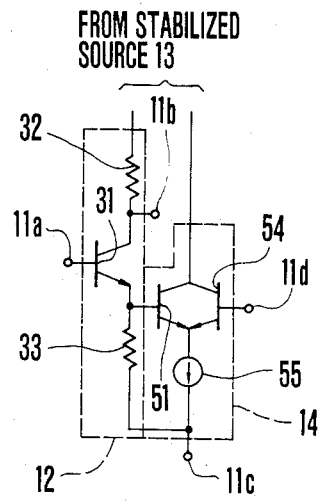
F I G. 15
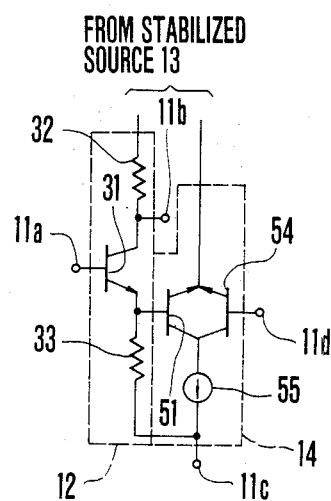
F I G. 16
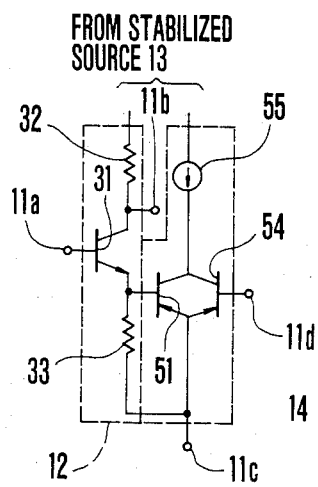
F I G. 17
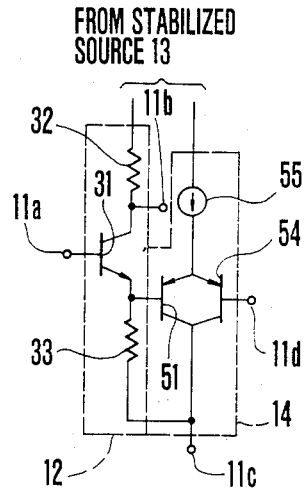
F I G. 18

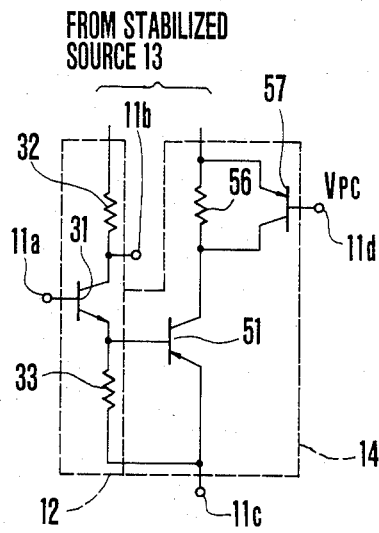
F I G. 19
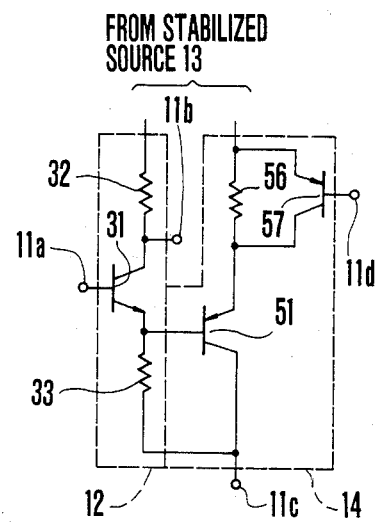
F I G. 20
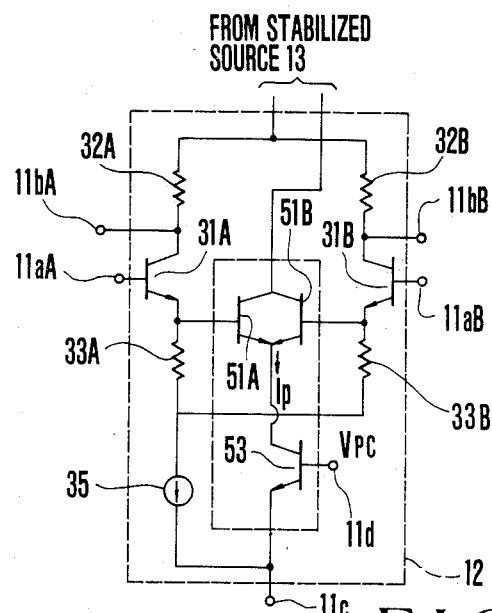
F I G. 21

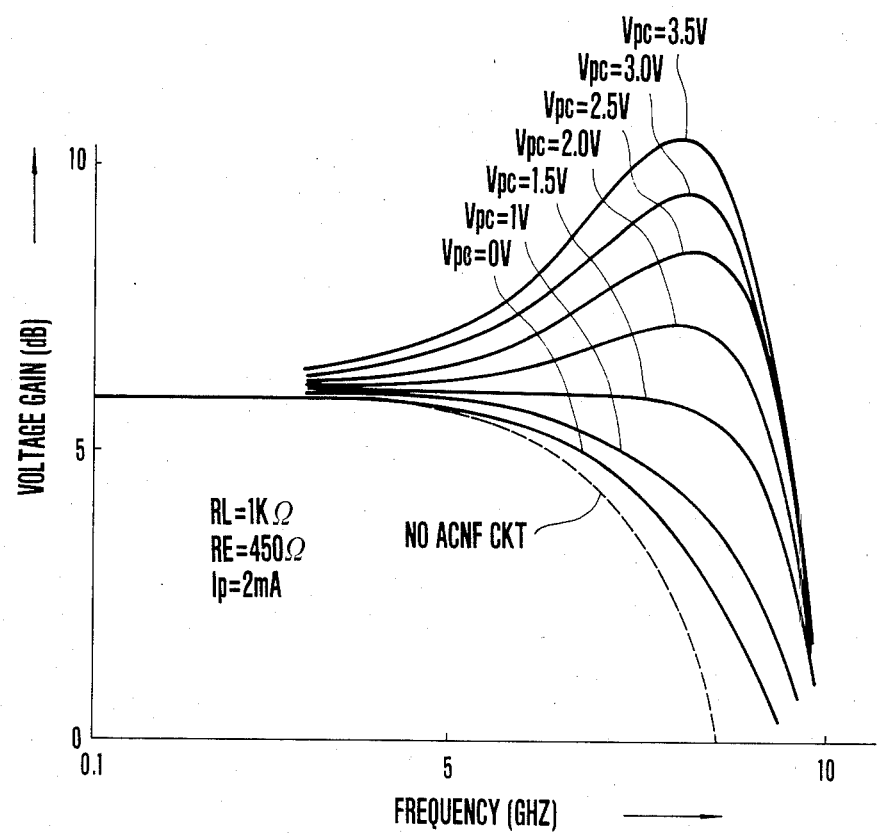
F I G. 22

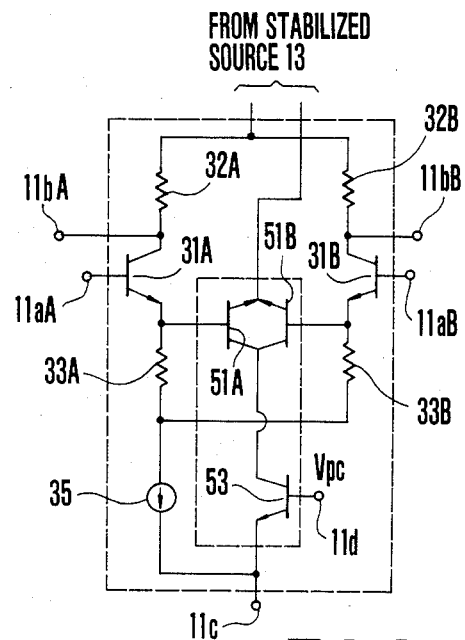
F I G. 23
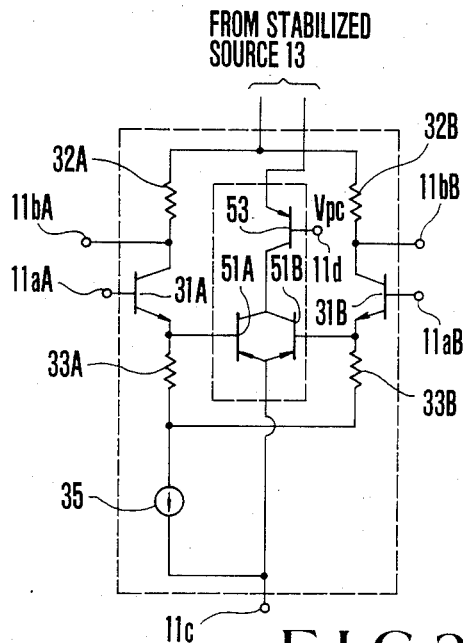
F I G. 24

MONOLITHIC INTEGRATED CIRCUIT DEVICE INCLUDING AC NEGATIVE FEEDBACK TYPE HIGH FREQUENCY AMPLIFIER CIRCUIT

BACKGROUND OF THE INVENTION

This invention relates to a monolithic integrated circuit device including an AC negative feedback type high frequency amplifier circuit.

In recent years, the amount of informations to be transmitted has increased greatly so that how much informations can be sent presents a serious problem. To solve this problem, a plurality of channels have been provided by increasing the transmission frequency or by increasing the capacity of a repeater.

With recent advance of circuit technology, monolithic integrated circuit has become important in view of economy, miniaturization and high reliability. Recent research is concentrated to combine the monolithic integrated circuit technique with a technique of transmitting a large quantity of informations by increasing the transmission frequency for miniaturizing the circuit while utilizing a number of channels in such high frequency band as several hundreds MHz. This resulted in various new techniques.

However, when the circuit device is fabricated with the monolithic integrated circuit technique, it is extremely difficult to manufacture, at a high yield, devices having predetermined characteristic by preparing circuit element having predetermined values as in the prior art in which the circuit device is fabricated with discrete component elements. Especially, when a device utilized in such high frequency band as several hundreds MHz is fabricated with a monolithic integrated circuit, dimensional errors of various component elements of the device, nonuniformity of the semiconductor material utilized to form the device and a small misalignment of the mask have a great influence upon the characteristics of the completed device. Especially, in an amplifier circuit utilized in a high frequency band higher than several hundreds MHz, nonuniformities described above greatly affect the frequency characteristic, thus decreasing the yield of satisfactory products.

Although various efforts have been made for solving the problems described above encountered when a high freqeuncy amplifier circuit is prepared with monolithic integrated circuit technique, satisfactory high yeild was not obtained which increases the cost of each device and makes it difficult to prepare it with mass production process.

SUMMARY OF THE INVENTION

Accordingly, the principal object of this invention is to provide a monolithic integrated circuit device including an AC negative feedback type high frequency amplifier circuit having a desired wide bandwidth frequency characteristic.

Another object of this invention is to provide a monolithic integrated circuit device having an AC negative feedback type high frequency amplifier capable of improving the yield of satisfactory products.

A further object of this invention is to provide a monolithic integrated circuit device including an AC negative feedback type high frequency amplifier capable of externally adjusting the frequency characteristic.

To accomplish these objects we have investigated whether the frequency characteristic can be adjusted or not so as to eliminate from outside the nonuniformity thereof instead of eliminating the nonuniformity by the integrated circuit itself, by noting that it is inevitable to obtain the nonuniformity of the frequency characteristic of the amplifier circuit so long as the high frequency amplifier circuit is fabricated with monolithic integrated circuit technique. Consequently, in a conventional high frequency amplifier circuit, a negative feedback is used for the purpose of improving the frequency characteristic. Among the negative feedbacks, we have found that an AC negative feedback is effective for widening the frequency bandwidth because it forms a peak on the high frequency side of the amplifier circuit, thus broadening the frequency bandwidth. The invention is based on this discovery.

To accomplish the object described above, according to this invention, a semiconductor impedance element is included in the AC negative feedback circuit of a high frequency amplifier circuit incorporated into a monolithic integrated circuit device. One end of the semiconductor impedance element is derived out to the outside of the monolithic integrated circuit device through an external terminal to connect it to the variable control device of the AC negative feedback circuit.

According to this invention there is provided a monolithic integrated circuit device including an AC negative feedback type high frequency amplifier circuit comprising a substrate on which the monolithic integrated circuit device is formed, an AC negative feedback circuit for the high frequency amplifier circuit, the AC negative feedback circuit including a semiconductor impedance element and connected to an external terminal on the substrate, and variable control means for adjusting an amount of AC feedback of the high frequency amplifier circuit.

BRIEF DESCRIPTION OF THE DRAWINGS

In the accompanying drawings:

FIG. 1 is a block diagram showing the basic construction of the monolithic integrated circuit including an AC negative feedback type high frequency amplifier circuit;

FIG. 2 shows the detail of the high frequency amplifier circuit shown in FIG. 1;

FIG. 5 is a connection diagram showing another example of the high frequency amplifier circuit shown in FIG. 1;

FIG. 6 is a graph showing the voltage gain—frequency characteristic of the high frequency amplifier circuit shown in FIG. 5;

FIGS. 12 through 21 are connection diagrams showing modifications of the high frequency amplifier circuit shown in FIG. 9;

FIG. 22 is a graph showing the voltage gain—frequency characteristic of the high frequency amplifier circuit shown in FIG. 22;

FIG. 23 is a connection diagram showing still another example of the high frequency amplifier circuit shown in FIG. 1;

FIGS. 24 and 25 are connection diagrams showing another examples of the high frequency amplifier circuit shown in FIG. 23;

DESCRIPTION OF THE PREFERRED EMBODIMENTS

Figure 3:
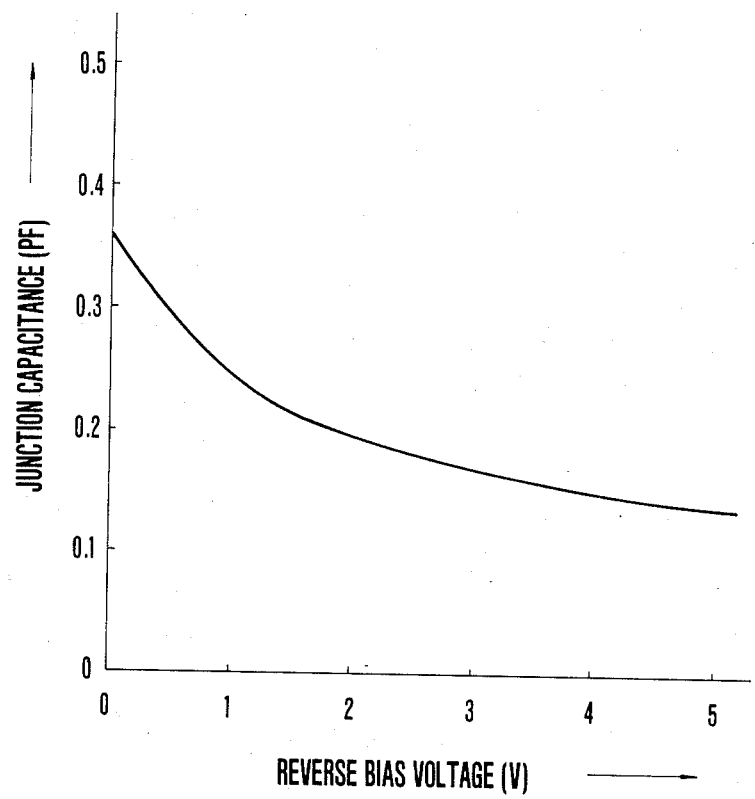
FIG. 3 is a graph showing the junction capacitance—reverse voltage characteristic of the diode utilized in the amplifier circuit shown in FIG. 2.

In the preferred embodiment of the AC negative feedback type high frequency amplifier circuit of this invention shown in FIG. 1, a solid line block 10 represents a monolithic integrated circuit wafer made of silicon, for example. An AC negative feedback type high frequency amplifier circuit often called a peaking amplifier is fabricated on the wafer by well known semiconductor technique. The high frequency amplifier circuit comprises, as its principal elements, an amplifier 12 which amplifies a high frequency input signal supplied from outside through a pad 11a (external terminal) and outputs the amplified signal via a pad 11b (external terminal) a stabilized source 13 supplying an operating power to the amplifier 12, and an AC negative feedback circuit 14 which adjusts the amount of the negative feedback and including a semiconductor impedance element. In this embodiment, the amplifier 12 and the stabilized source 13 (and if necessary the AC negative feedback circuit 14 too) are grounded through a pad 11c (external terminal). The AC negative feedback circuit 14 is an element that characterizes this invention and one terminal of the semiconductor impedance element contained therein is connected to an external control device which control the amount of the AC feedback through a pad 11d (external terminal). The stabilized source 13 is connected to an external source through a pad 11e (external terminal).

With the construction shown in FIG. 1, the AC negative feedback circuit 14 can be controlled from the outside of the semiconductor wafer on which the monolithic integrated circuit is fabricated. Moreover, by controlling the amount of the AC negative feedback, the frequency characteristic of the amplifier circuit can be improved. Especially, it is possible to widen the bandwidth in the high frequency band, thus enabling to obtain a monolithic integrated circuit device including an AC negative feedback type high frequency amplifier circuit having a desired wide band frequency characteristic. Since the amount of the AC negative feedback can be controlled from outside, such amount can be adjusted independently of the DC negative feedback quantity. Moreover, as the amount of the AC negative feedback can be adjusted as desired, even when the characteristics of the component elements of the monolithic integrated circuit are not uniform so that a desired frequency characteristic can not be obtained, any desired frequency characteristic can be obtained by adjusting the amount of the AC negative feedback. Consequently the percentage of rejection of the monolithic circuit per bit can be minimized measuring an improvement of the yield.

The feature of the high frequency amplifier circuit of this invention can be more clearly understood from the following detailed description of the embodiments.

FIGS. 2, 5, 7 and 8 show examples of the peaking amplifier circuit utilizing a diode as the semiconductor impedance element of the AC negative feedback quantity.

FIG. 2 having the simplest construction will firstly be described in which the amplifier 12 is constituted by a NPN transistor 31, a load resistor 32 with one end connected to the collector electrode of the transistor 31, and an emitter resistor 33 (that is a DC negative feedback resistor) with one end connected to the emitter electrode of the transistor. The base electrode of transistor 31 is supplied with an input signal via pad 11a, while the collector electrode sends out an output signal via pad 11b. The other end of the load resistor 32 is connected to the stabilized source 13 shown by (+V), while the other end of the emitter resistor 33 is grounded through pad 11c. Further, the emitter electrode of the transistor 31 is connected to the cathode electrode of a diode 41 constituting a semicondutor impedance element of the AC negative feedback circuit 14. The anode electrode of diode 41 is connected to an external control device 20 for controlling the AC negative feedback quantity via pad 11d. The control device 20 a variable voltage source, for example, for applying a variable reverse bias to the diode 41, and the other end of the control device 20 is grounded. Accordingly, the junction capacitance of the diode under reverse bias is utilized as the AC impedance.

With this construction by adjusting the control device 20 a desired amount of the AC negative feedback can be applied to the amplifier 12 independently of the amount of the DC negative feedback provided by the emitter resistor. As shown in FIG. 3, the junction capacitance of the diode 41 varies in accordance with the magnitude of the reverse bias voltage Vc.

FIG. 3 shows the relation between the reverse bias voltage Vc and the junction capacitance when the junction area of the first and second semiconductor regions constituting the junction capacitance is 100 microns 2, the impurity concentration of the first semiconductor region is about $10^{20}$ atoms/cm$^3$, the impurity concentration of the second semiconductor region is $10^{18}$ atoms/cm$^3$.

Figure 4:
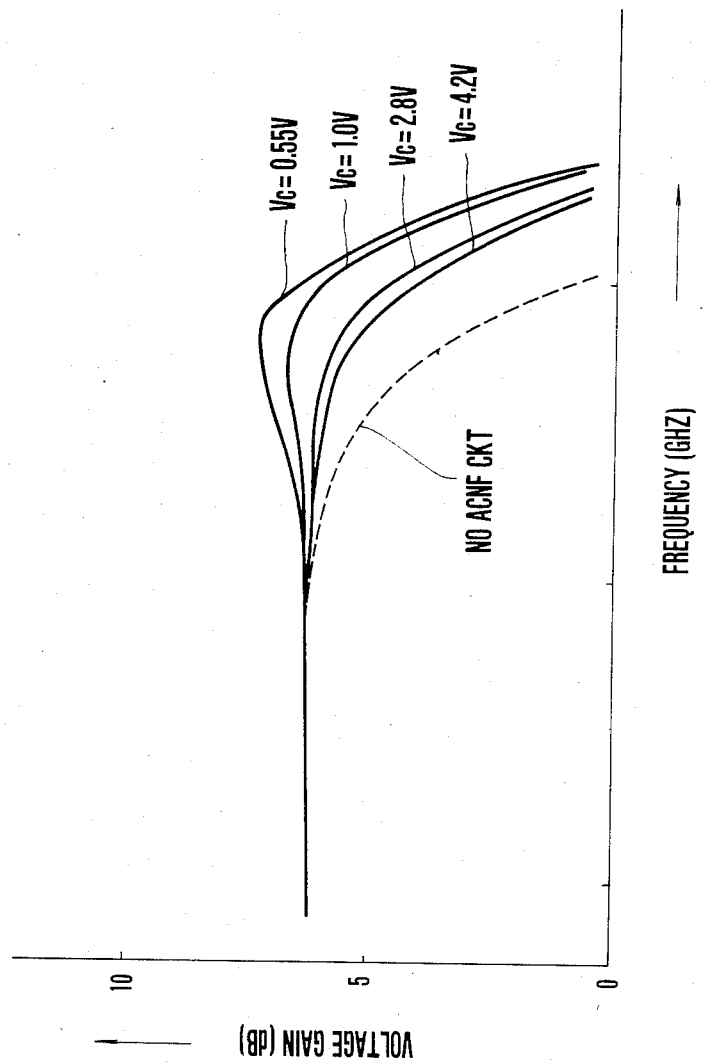
FIG. 4 is a graph showing the voltage gain—frequency characteristic of the high frequency amplifier circuit shown in FIG. 2.

Such diode junction capacitance—reverse bias voltage characterstic gives a frequency characteristics as shown in FIG. 4 which were obtained with a load resistor 32 of 1K ohm, emitter resistor 35 of 450 ohms and emitter current of $I_E=1$ mA.

As the reverse bias voltage Vc is applied across the junction capacitance increases, in other words as the control voltage Vc impressed upon the external terminal from the control device 20 decreases the frequency characteristic can be improved. Accordingly, it is possible to readily correct the nonuniformity of the products caused by manufacturing conditions by varying the negative bias voltage applied to the diode constituting the AC negative feedback circuit 14. Moreover, design errors can readily be corrected.

In the meanwhile, AC negative feedback function is, when defined strictly, performed by the AC negative feedback circuit 14 in cooperation with the DC feedback circuit which is constituted by a pure resistor 33 such as emitter resistor. However, in the present specification, it should be noted that the AC negative feedback operation of the DC feedback circuit 33 is neglected since the DC feedback circuit does not have significant effect on the frequency characteristic, particularly the peaking characteristic of the high frequency amplifier circuit.

FIG. 5 shows a connection diagram in which the high frequency circuit is modified to a differential type, in which elements corresponding to those shown in FIG. 1 are designated by the same reference numeral added with suffixes A and B. The circuit shown in FIG. 5 is different from that shown in FIG. 1 in that a current source 35 is connected between the juncture between the emitter resistors 33A and 33B and the pad 11c. In this modification, as the semiconductor impedance elements of the AC negative feedback element 14 are used first and second diodes 41A and 41B connected to apply a negative bias between the emitter electrodes of transistors 31A and 31B and the pad 11d. The control device 20 supplies a predetermined reverse bias voltage to the diodes 41A and 41B via pad 11d.

FIG. 6 shows the frequency characteristics of the high frequency amplifier circuit shown in FIG. 5 in which the absissa represents the frequency, while the ordinate voltage gain. The frequency characteristics shown in FIG. 6 were obtained with load resistors 32A and 32B each having 1K ohm, emitter resistors 33A and 33B each having a value of 450 ohms, current of the current source 35 of I=2 mA and a voltage applied to the pad 11d of Vc=0−2.0 V. A dotted line curve shows the frequency characteristic where no AC negative feedback circuit is used. As can be noted from these characteristic curves, as it is possible to adjust the frequency characteristic of the high frequency circuit by adjusting the quantity of the AC negative feedback to any desired value from outside of the monolithic integrated circuit, the nonuniformity of the products can be readily corrected, thus improving the yield.

In the foregoing embodiments, since the difference between the emitter potential of the transistor and the potential of the pad that is the external potential is applied to the diode as the reverse bias voltage there is an inconvenience that it is necessary to reset the bias voltage supplied to the pad 11d to an optimum value on the emitter peaking characteristic each time the emitter voltage varies with the change of the DC bias of a corresponding transistor. With the construction described above, the applicable range of the bias voltage to be varied is also limitted by the circuit construction.

The following embodiments are proposed to solve these problems.

Figure 7:
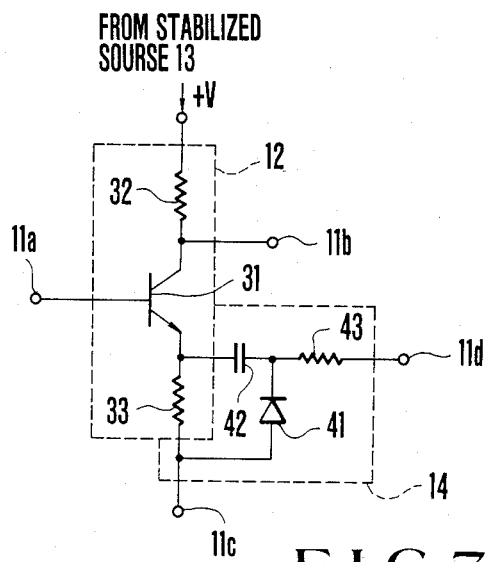
FIGS. 7, 8 and 9 are connection diagrams showing the examples of the high frequency amplifier circuit shown in FIG. 1.

FIG. 7 shows an improvement of the circuit shown in FIG. 2 in which corresponding circuit elements are designated by the same reference characters. In FIG. 7, the AC negative feedback circuit 14 connected to the emitter electrode of transistor 31 comprises a fixed capacitor 42, a diode 41 and a resistor 43. One end of the fixed capacitor 42 is connected to the emitter electrode of the transistor 31, while the other end is connected to the pad 11d via the resistor 43 and to the pad 11c via diode 41. Thus, a serial combination of capacitor 42 and diode 41 is connected in parallel with the emitter resistor 33 for DC feedback. The juncture between the capacitor 42 and the diode 41 is connected to a control device for adjusting the amount of the AC negative feedback via resistor 43 and pad 11d. In this embodiment too, the anode electrode of diode 41 is connected to pad 11c so that the junction capacitance thereof can be used at the time of reverse bias. Denoting the capacitances of capacitor 42 and the junction capacitance of the diode 41 by Co and Cj respectively, the equivalent peaking capacitance Cp is given by the following equation:

$$Cp = \frac{Co \cdot Cj}{Co + Cj}$$

With this connection, the AC negative feedback circuit 14 is isolated (in terms of DC) from the emitter electrode of the transistor 31 so that it is not necessary to change the reverse bias voltage applied to the pad 11d when the bias condition of the transistor 31 varies.

Figure 8:
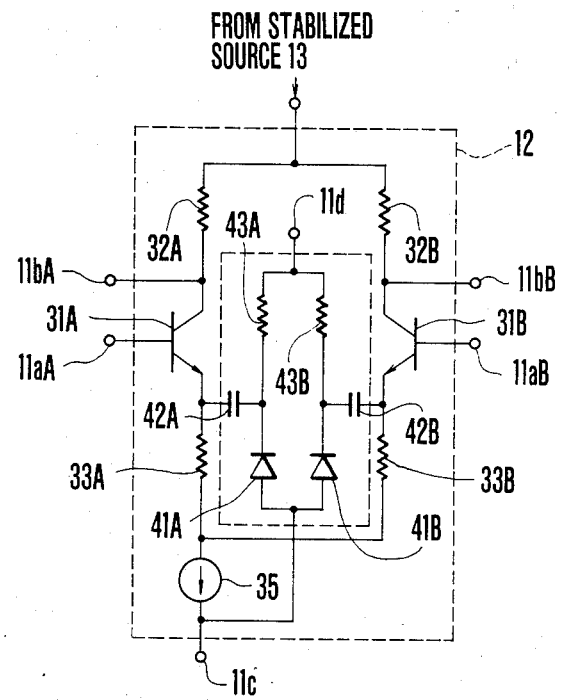

FIG. 8 shows an improvement of the circuit shown in FIG. 5 in which elements corresponding to those shown in FIG. 5 are designated by the same reference characters. The AC negative feedback circuit connected to the emitter electrodes of transistors 31A and 31B has the same construction as that shown in FIG. 7. More particularly, between the emitter electrode of transistor 31A and the pad 11c are connectd in series a capacitor 42A and a diode 41A, and a resistor 43A is connected between the juncture between the capacitor 42A and diode 41A and pad 11d connected to the control device 20. In the same manner, serially connected capacitor 42B and a diode 41B are connected between the emitter electrode of transistor 31B and pad 11c and resistor 43B is connected between the junction between capacitor 42B and diode 41B and pad 11d. A predetermined reverse bias voltage is applied to the cathode of the first and second diodes 41A and 41B from the pad 11d via resistors 43A and 43B respectively. With this construction, it is not necessary to change the reverse bias voltage supplied to the pad 11d when the bias condition of the first and second transistors 31A and 31B changes.

FIGS. 9 through 25 show other examples of the monolithic integrated circuit embodying the invention in which the diffusion capacitance of a transistor is used as a semiconductor impedance that adjusts the amount of AC negative feedback.

Figure 9:
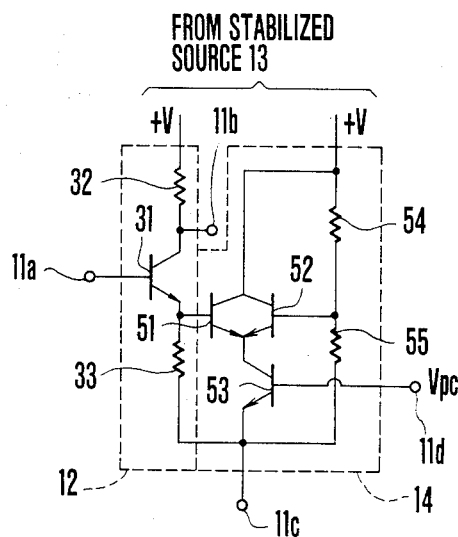

In the embodiment shown in FIG. 9, the amplifier 12 is made up of an NPN transistor 31, a load resistor 32, and an emitter resistor 33 acting as a DC negative feedback resistor, in the same manner as in the previous embodiment. The base electrode of transistor 31 is supplied with an input signal via pad 11a to send out an output signal from the collector electrode via pad 11b.

The AC negative feedback circuit 14 characterizing the invention comprises an NPN transistor 51 acting as an AC negative feedback semiconductor impedance element. In this example, the diffusion capacitance between the base and emitter electrodes of the transistor 51 is used as the peaking capacitance. Since the impedance of the transistor 53 acting as a current source as seen from transistor 51 is high, a transistor 52 is connected in parallel with transistor 51 to operate as a common base circuit type to decrease the AC impedance. The base electrode of transistor 51 is connected to the emitter electrode of transistor 31, and the emitter electrodes of transistor 51 and of NPN transistor 52 are grounded via pad 11c and an NPN transistor 53, whereby the diffusion capacitance between the base and emitter electrodes of transistor 51 acts as the peaking capacitance. The collector electrodes of transistors 51 and 52 are connected to the stabilized source 13 to be applied with a voltage of +V resistors 54 and 55 act as bias resistors for transistor 52. The peaking capacitance Cpc is approximately given by $(g_m \cdot \tau_F)/h_{FE}$ (diffusion capacitance between the base and emitter electrodes) where gm represents the mutual conductance of transistor 51 and $_F$ the forward base transit time of minority carriers, and where it is assumed that the junction capacitance is sufficiently small. Since the mutual conductance gm is expressed by $$gm = \frac{q}{KT} I_p$$

(where K is a Boltsman constant, T the absolute temperature, q electric quantity and $I_p$ current flowing through transistor 51), the peaking capacitance Cpc would be expressed by $$Cpc \cong \frac{q \cdot \tau_F}{KT \cdot h_{FE}} \cdot I_p$$

Figure 10:
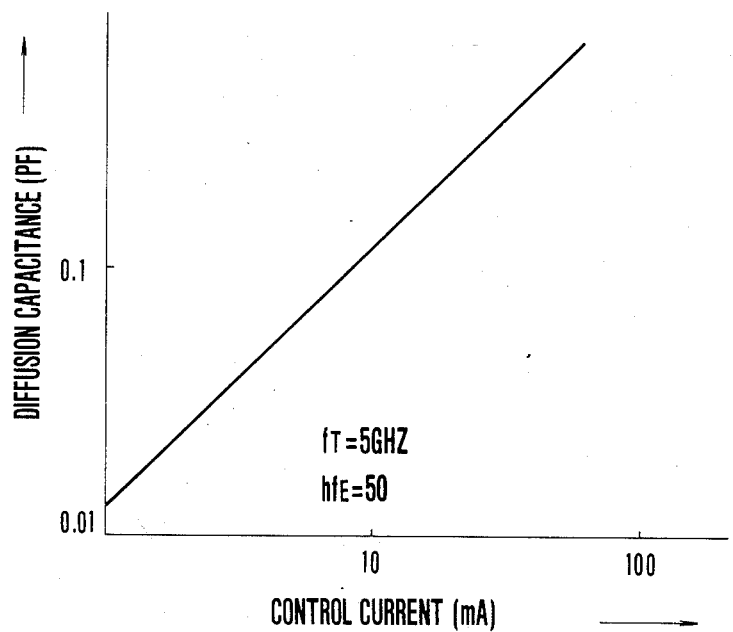
FIG. 10 is a graph showing the relationship between the diffusion capacitance between the base and emitter electrodes of the transistor shown in FIG. 9 and control current.

The relationship between Ip and Cpc when $f_T=5$ GHz and $h_{FE}=50$ is shown by FIG. 10. Accordingly, by varying the current Ip flowing through the transistor 51, the capacitance of the peaking capacitance can be varied. The purpose of the peaking control transistor 53 is to control the current Ip flowing through the transistor 51. Further, it is possible to control the current Ip by varying the voltage Vpc applied to the control device 20 via the base electrode 53 and pad 11d acting as the peaking control terminal.

Consequently by setting the voltage Vpc impressed upon control pad 11d to any desired value, any desired peaking characteristic can be obtained. Where the base—emitter resistance of the peaking control transistor 53 is sufficiently larger than the series feedback resistor 33 (R31) the voltage gain Avc of the amplifier circuit is approximately expressed by $$Avc \cong \frac{R_L}{R_Z\left(1+j\frac{w}{wb}\right)} \left(1 + jw\, R_{Z1} \frac{q - \tau_F}{KT \cdot h_{FE}} I_p\right) \quad (1)$$

Accordingly by adjusting Ip, any desired peaking characteristic can be obtained, thereby broadening the frequency bandwidth of the amplifier circuit.

Figure 11:
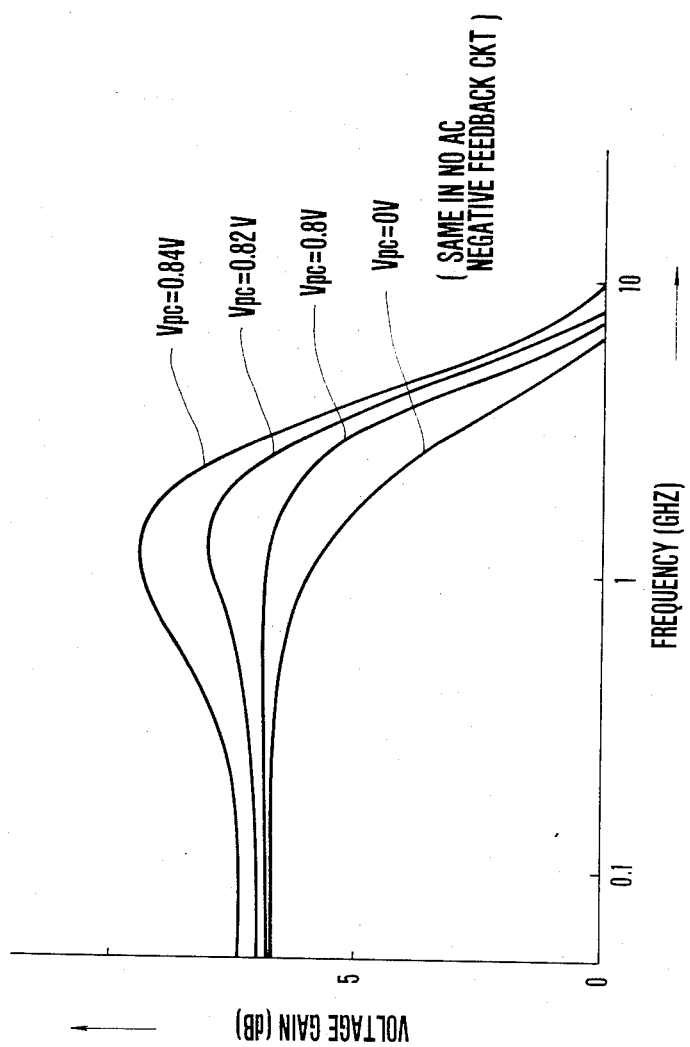
FIG. 11 is a graph showing the voltage gain—frequency characteristic of the high frequency amplifier circuit shown in FIG. 9.

FIG. 11 shows a voltage gain—frequency characteristics of the circuit shown in FIG. 9 wherein the voltage Vpc applied to the base electrode of the transistor 53 from the control device 20 was varied between 0 V and 0.84 V. In FIG. 11 a control characteristic when an AC negative feedback circuit was not used is the same as that when $V_{pc}=0$ V. The characteristics shown in FIG. 11 were obtained with element having the following values.

| Resistance value of load resistor 31 | 1K ohm |
| Resistance value of emitter resistor | 450 ohms |
| Emitter current of transistor 53 | 0–1.52 mA |

Figure 12:
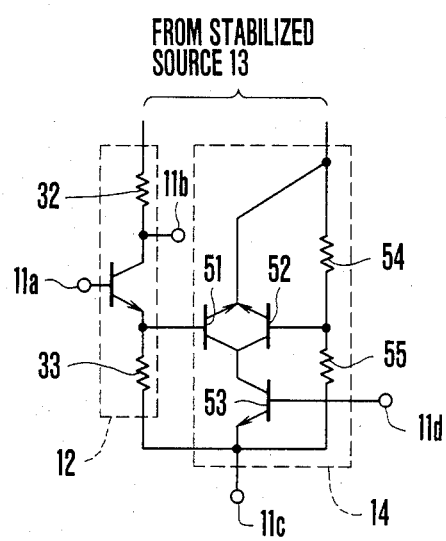

FIG. 12 shows a modification of FIG. 9 which is different in that the connections of the emitter and collector electrodes of transistor 52 are reversed. Of course in this case the stabilized source 13 has a voltage lower than that applied to the pad 11c. In this case, the diffusion capacitance between the base and collector electrodes of transistor 51 is used as the negative feedback semiconductor impedance of the AC negative feedback circuit.

The circuit shown in FIG. 12 operates in the same manner as in FIG. 9, but the reverse direction peaking capacitance Cpc is expressed by $$Cpc = \frac{q \cdot \tau_R}{KT \cdot h_{FE}} I_p$$

(where $\tau_R$ represents the reverse base transit time) which is given by the base collector diffusion capacitance. When compared with the amplifier circuit shown in FIG. 8, in the circuit shown in FIG. 13, since $\tau_R >> \tau_F$ it is possible to obtain larger peaking capacitance, and the voltage gain is given by equation (1) described above except that $\tau_F$ is replaced by $\tau_R$. The circuit shown in FIG. 13 has the same advantages as those of the circuit shown in FIG. 8.

Figure 13:
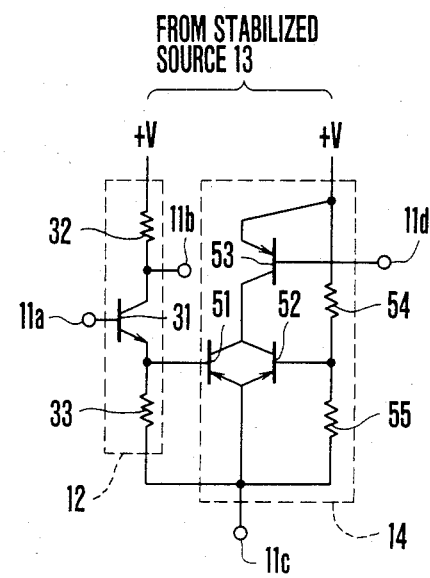

FIG. 13 shows a modification of FIG. 9 different therefrom in that transistors 51, 52 and 53 are substituted by PNP transistors and that the transistor 53 acting as the current source is disposed on the collector side of a transistor pair 51 and 52. Since the circuit shown in FIG. 13 operates in the same manner as in FIG. 9, it will not be described herein.

Figure 14:
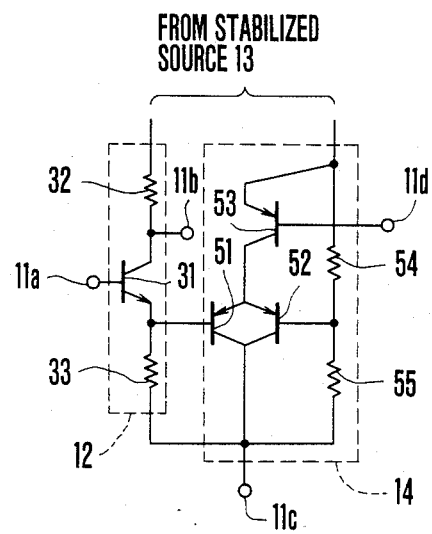

FIG. 14 shows a modification of FIG. 13 which is different therefrom in that the connections of collector and emitter electrodes of transistors 51 and 52 are reversed so as to utilize the base-collector diffusion capacitance of the transistor 51 as the negative feedback semiconductor impedance element. The circuit shown in FIG. 14 operates in the same manner as in FIG. 12.

FIG. 15 shows still another embodiment of this invention which it differs from FIG. 9 in that the current Ip flowing through transistor 51 is controlled according to different method. More particularly, in the circuit shown in FIG. 15, the AC negative feedback circuit 14 comprises a negative feedback semiconductor impedance element. This impedance element comprises transistors 51 and 54 with their collector and emitter electrodes interconnected, and a constant current circuit 55 connected between the emitter electrode of transistor 51 and pad 11c. The control device 20 is connected to the base electrode of transistor 54 via pad 11d, and the collector electrode of transistor 54 is connected to the stabilized source 13. The current flowing through the transistor 54 is controlled by the voltage supplied from the control device 20 via pad 11d for controlling the current Ip flowing through complemental transistors. Other operations are identical to those of FIG. 9.

FIG. 16 shows still another embodiment of this invention which is different from that shown in FIG. 15 in that transistor 51 and the AC negative feedback control transistor 54 are operated oppositely. Other points are the same as in FIG. 15.

FIG. 17 shows yet another embodiment of this invention which is different from that shown in FIG. 15 in that the NPN transistor 51 and the NPN AC negative feedback control transistor 54 shown in FIG. 16 are substituted by PNP transistors. In this modification, the constant current source 55 is connected between the collector electrodes of transistors 51 and 54 and the stabilized source 13. This modification too operates in the same manner as in the amplifier circuit shown in FIG. 15.

In a modification shown in FIG. 18 the transistors 51 and 54 shown in FIG. 17 are operated oppositely, the other construction being the same as in FIG. 17. In the embodiment shown in FIG. 19 instead of connecting the base electrode of transistor 51 to the emitter electrode of transistor 31 as in the series feedback type amplifier circuit shown in FIG. 9, the collector electrode of transistor 51 is connected to the stabilized source 13 via a resistor 56. Furthermore, the collector electrode of a transistor 57 is connected to the collector electrode of transistor 51, while the emitter electrode of transistor 57 is connected to the stabilized source 13. Consequently by controlling voltage Vpc applied to the AC feedback control pad 11d from the control device 20, the current flowing through transistor 51 can be controlled to control the base—emitter diffusion capacitance thereof, thereby adjusting the amount of AC negative feedback. Where the value of resistor 56 is sufficiently smaller than that of the series feedback resistor 33 the voltage gain of this modification can be shown by equation (1) described above, so that any desired peaking characteristic can be obtained by controlling the voltage applied to the AC negative feedback control pad 11d.

The modification shown in FIG. 20 is different from that shown in FIG. 19 in that the transistor 51 is operated reversely but operates in the same manner.

FIG. 21 shows a still further modification of this invention which is suitable for use as a differential type high frequency amplifier circuit. In FIG. 21 elements corresponding to those shown in FIG. 9 are designated by the same reference numerals added with suffixes A and B. In this embodiment, a current source 35 is connected between the junction between the emitter resistors 33A and 33B and the pad 11c. In this embodiment, as the semiconductor impedance element of the AC negative feedback circuit 14 is used the diffusion capacitance between the base—emitter electrodes of NPN transistor pair 51A and 51B. The collector electrodes of these transistors are connected to the stabilized source 13 while the emitter electrodes are connected to the grounded pad 11c via an NPN transistor 53 acting as a current source. The base electrode of transistor 53 is connected to the pad 11d receiving the control voltage from the control device 2a.

With this construction, the base—emitter diffusion capacitances of transistors 51A and 51B of the AC negative feedback circuit 14 are connected in series and both ends of the capacitance are connected to the emitter electrodes of the transistors 31A and 31B. The peaking capacitane, that is the sum Cpc of both diffusion capacitances can be approximately expressed by $$Cpc \simeq \tfrac{1}{2} \frac{q \cdot \tau_F}{KT \cdot h_{FE}} \cdot I_p$$

when it is assumed that the both diffusion capacitances are equal. Thus, by controlling the current Ip flowing through transistors 51A and 51B the value of the diffusion capacitance can be varied. The purpose of transistor 53 is to control the current Ip flowing through the transistor pair 51A and 51B and by varying the voltage Vpc impressed upon the pad 11d, the current Ip can be varied for obtaining any desired peaking characteristic. When Rz1=Rz2, the equation of the voltage gain is the same as equation 1 described in connection with FIG. 9.

FIG. 22 shows the relationship between the voltage gain (dB) and the frequency in GHz. When the value $R_L$ of the load resistor 32 of the high frequency amplifier circuit is 1K ohm, the resistance value $R_E$ of the DC negative feedback resistor 33 is 450 ohms, the emitter current $I_p$ flowing through the DC negative feedback resistor is 2 mA and when the control voltage applied to the pad 11d from the variable control device 20 is varied between 0 and 3.5 V. The dotted line shown in FIG. 22 shows a characteristic when no AC negative feedback circuit is provided.

As can be noted from these characteristics, even when the characteristics of the high frequency amplifier circuit prepared with monolithic technique are not uniform, by controlling from outside the amount of the AC negative feedback according to this invention, products which must be discarded can be corrected to have desired frequency characteristics.

FIG. 23 shows a modification of FIG. 21 which is different therefrom in that transistors 51A and 51B are operated reversely, and the base—collector diffusion capacitances of transistor pair 51A and 51B are used as the diffusion capacitance. This modification operates in the same manner as in FIG. 21.

FIG. 24 shows still another modification of this invention similar to that shown in FIG. 21 except that PNP transistors are used instead of NPN transistors 51A and 51B and the AC negative feedback controlling NPN transistor 53. The emitter electrodes of the transistor pair 51A and 51B are connected directly to pad 11c and the collector electrodes are connected to the stabilized source 13 via a PNP transistor 53 acting as a current source. The base electrode of transistor 53 is connected to pad 11d supplied with the control voltage $V_{DC}$ from the control device. The operation and advantages of this modification are similar to those of the embodiment shown in FIG. 21.

Figure 25:
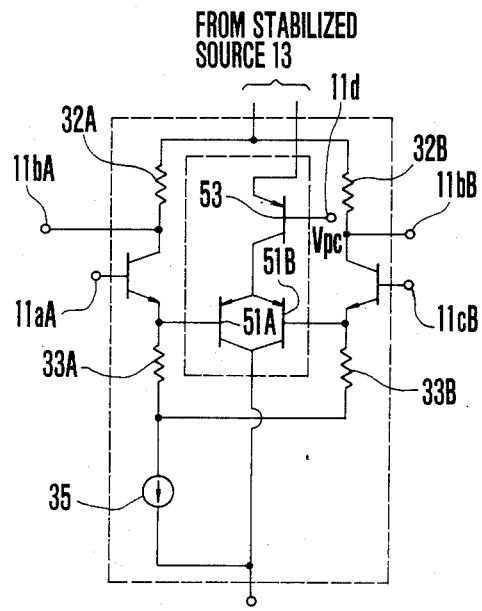

FIG. 25 shows a modification of FIG. 24 in which the AC negative feedback transistor pair 51A and 51B are operated reversely. This modification operates in the same manner as that shown in FIG. 23.

FIGS. 26 through 34 show other embodiments in which a differentiated resistance of a diode is used as the semiconductor impedance element for adjusting the amount of AC negative feedback.

Figures 26, 27:
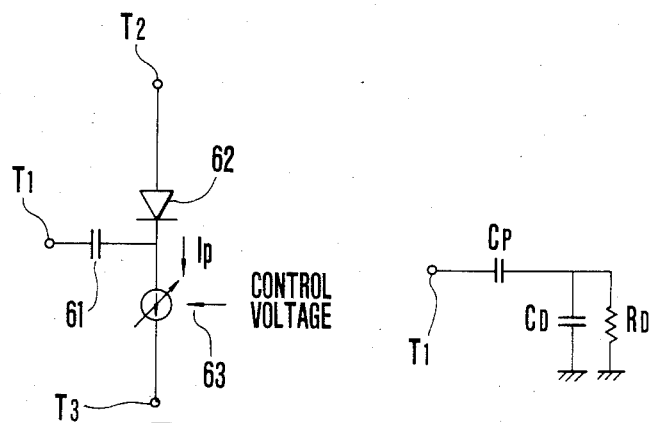
FIG. 26 is a connection diagram showing the basic construction of the AC negative feedback circuit useful to explain another example of the high frequency amplifier circuit shown in FIG. 1.
FIG. 27 shows an AC equivalent circuit of the circuit shown in FIG. 26.

FIG. 26 shows the principle of the AC negative feedback circuit 14 which is applied to the high frequency amplifier circuit shown in FIGS. 2 or 5.

The AC negative feedback circuit 14 shown in FIG. 26 comprises a fixed capacitor 61 for DC interruption with one terminal T1 connected to the emitter electrode of transistor 31 (FIG. 2) of the high frequency amplifier circuit, and serially connected diode 62 and a variable current source 63 controlled by an external input signal. The other end of capacitor 61 is connected to the juncture between the diode 62 and the current source 63. The anode terminal T2 is connected to a stabilized source, for example while the terminal T3 is grounded. The AC negative feedback circuit 64 of this construction is shown by an equivalent AC circuit shown in FIG. 27 comprising capacitors $C_P$ and $C_D$ and a resistor $R_P$, in which $C_D$ represents the diffusion capacitance of diode 62, $R_D$ the differentiated resistance of diode 62 and $C_P$ the capacitance of the fixed capacitor 61. The impedance of this equivalent circuit as viewed from the terminals T1 and T3 is shown by the following equation.

$$Z = \frac{1 + jwR_D(C_P + C_D)}{jwC_P(1 + jwR_D \cdot C_D)} \quad (2)$$

Figure 28:
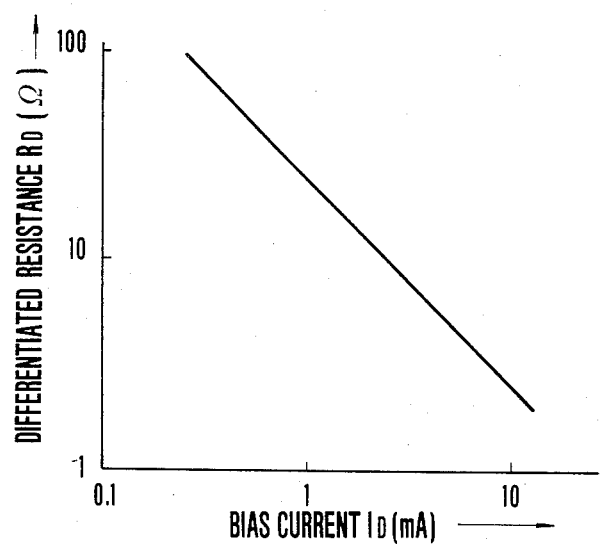
FIG. 28 is a graph showing the differentiated resistance—bias current characteristic of the diode utilized as the semiconductor impedance element shown in FIG. 27.

The differentiated resistance $R_D$ of the diode 62 can be varied as shown in FIG. 28 by varying the bias current.

Figure 29:
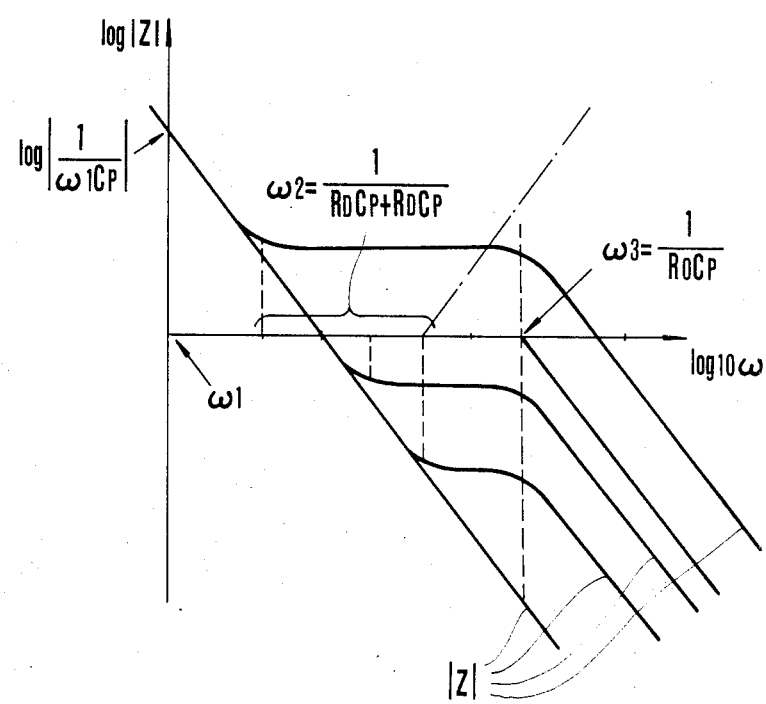
FIG. 29 is a graph for explaining the principle of operation of the AC negative feedback circuit shown in FIG. 28.
Figure 30:
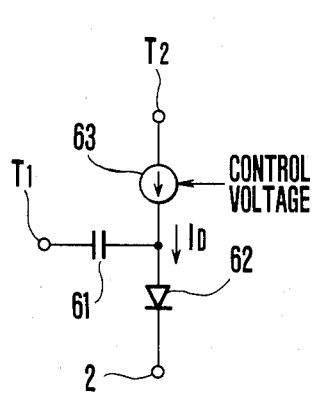
FIG. 30 is a connection diagram showing a modification of the AC negative feedback circuit shown in FIG. 28.

The value of product $R_D \cdot C_D$ in equation (2) is determined by the cut off frequency of the diode and is always constant irrespective of the operating current $I_D$ so that the frequency characteristic of the impedance shown by equation (2) can be shown by FIG. 29. Thus it has poles w1 and w3 determined by 0 and product $R_D C_D$ and a zero point determined by $R_D (C_P+C_D)$. The poles w1 and w2 are fixed inespective of the operating current $I_D$ of the diode 62, and pole w2 can be varied between two poles w1 and w2 by properly selecting $C_P$ or by adding adjusted current $I_D$ to $R_D$. For this reason, it is possible to make flat a portion of the frequency characteristic of the impedance Z as shown in FIG. 29 and the region of the flat portion can be adjusted freely. Although, the adjustment of $C_P$ is difficult where the amplifier circuit is made of an integrated circuit, adjustment of $R_D$ or $I_D$ can be made readily by varying the control voltage generated by the control device and applied to the external terminal connected to the variable current source 63. FIG. 30 shows a modification of the circuit shown in FIG. 26 in which the connection of the variable current source 63 and the diode 62 is reversed. This modification alse operates in the same manner as that shown in FIG. 26 with the same advantage.

Figure 31:
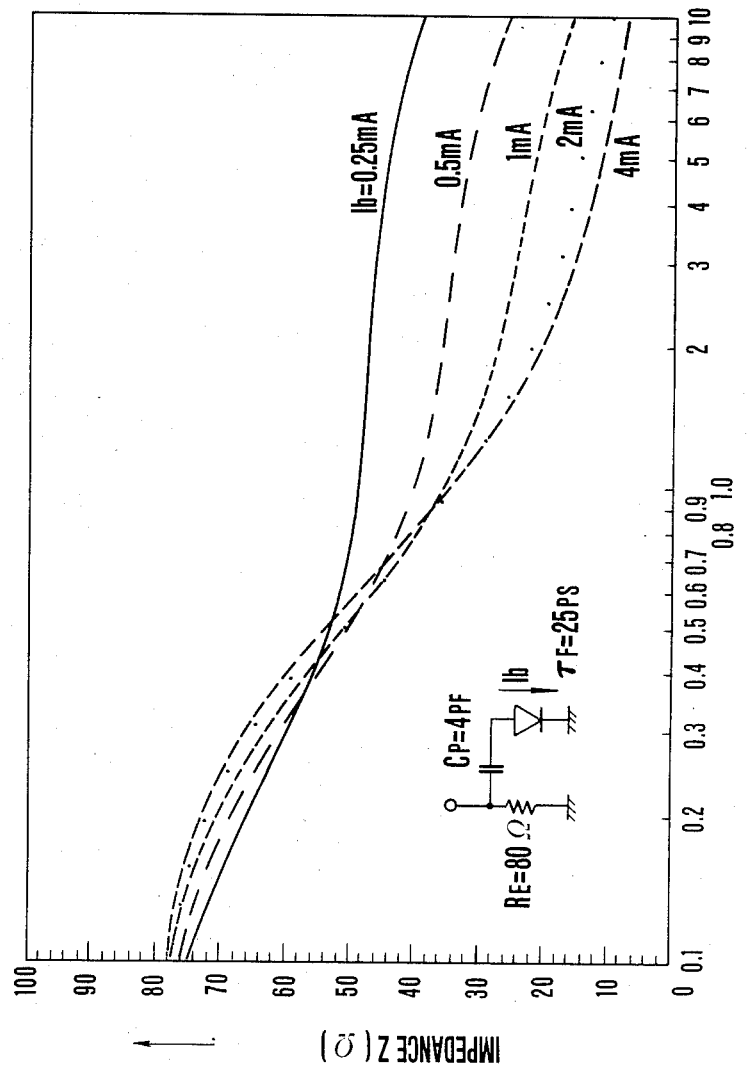
FIGS. 31 and 32 are graphs showing the frequency characteristics of the parallel impedance of an AC negative feedback circuit and a DC negative feedback resistor.
Figure 32:
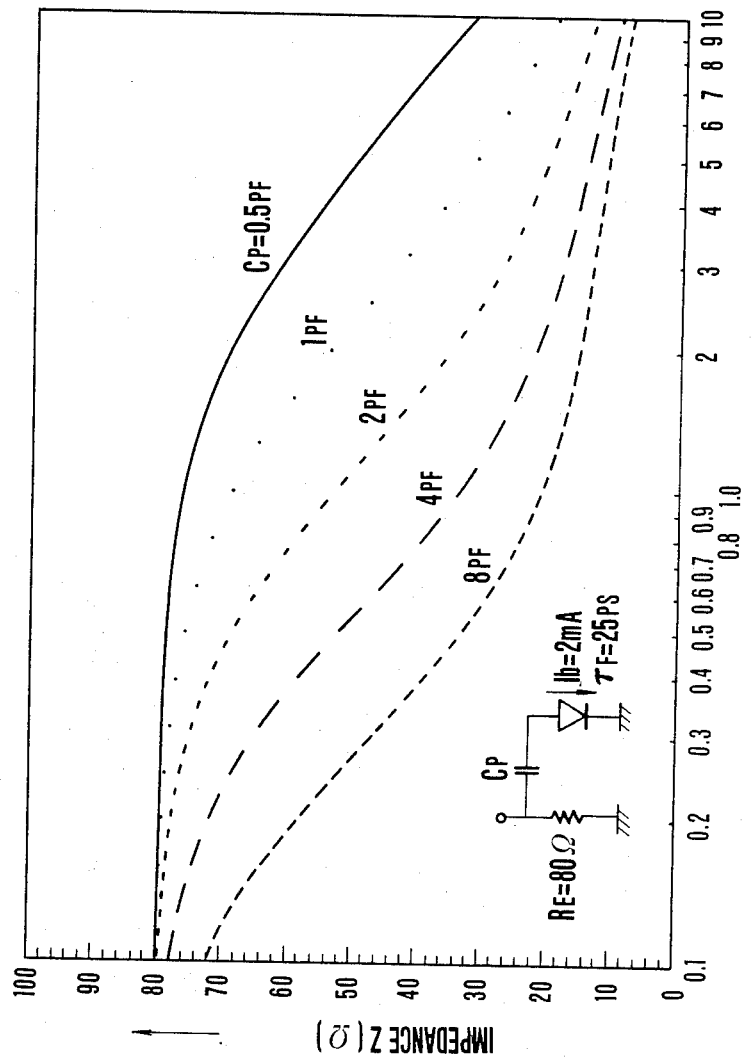

FIGS. 31 and 32 show the frequency characteristic in a case where a DC feedback resistor RE of the high frequency circuit is connected in parallel with a AC feedback circuit. FIG. 31 is plotted taking the current $I_D$ as the parameter while FIG. 32 is plotted taking capacitance $C_P$ as the parameter. These characteristics are plotted with a resistor $R_E$ of 80 ohms, and the forward base transit time $\tau_F$ of the diode of 25 ps. FIG. 31 shows that the impedance of the flat portion can be independently adjusted with current $I_D$, and that the point at which the impedance begins to decrease, that is the pole does not vary appreciably even when current $I_D$ is changed. On the otherhand, FIG. 32 shows that the point t which the impedance begins to decrease, that is the pole can be adjusted by varying $C_P$, and that the impedance of the flat portion does not change even when $C_P$ is varied. As above described it is possible to provide a characteristic having a flat portion and in which the pole of the impedance can be changed freely.

The fact that the impedance of the flat portion can be adjusted by direct current $I_D$ contributes to the realization of a peaking amplifier.

Figure 33:
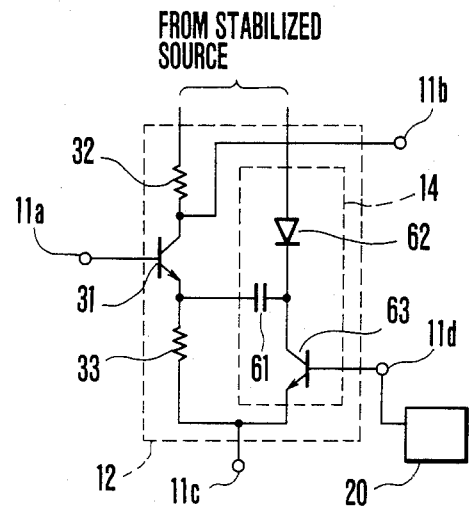
FIGS. 33 and 34 are connection diagrams showing high frequency amplifier circuits utilizing the AC negative feedback circuit shown in FIG. 26.
Figure 34:
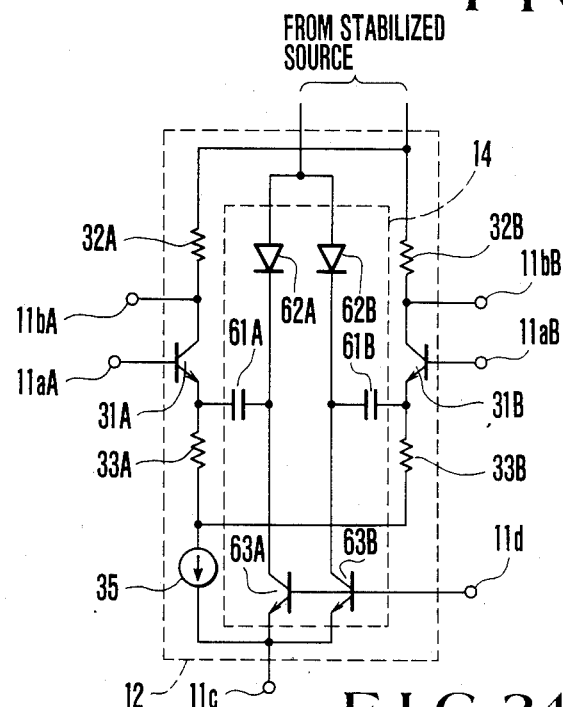

FIGS. 33 and 34 show applications wherein the AC negative feedback circuit that utilizes the differentiated resistance of the diode shown in FIG. 26 as the AC negative feedback semiconductor impedance element is incorporated into an actual high frequency circuit. The amplifier 12 shown in FIG. 33 is constituted by a trnsister 31, a load resistor 32, and a DC negative feedback resistor 33. An input signal is supplied to the base electrode of transistor 31 via pad 11a from outside of the monolithic integrated circuit to send out an output to the outside of the monolithic integrated circuit from the collector electrode of the transistor 31 via pad 11b. The collector electrode of transistor 31 is connected to the stabilized source via resistor 32, which the emitter electrode is connected to pad 11c of the monolithic integrated circuit, which is grounded. The AC negative feedback circuit 14 shown in FIG. 33 is connected to the emitter electrode of transistor 31. More particularly, the emitter electrode of transistor 31 is connected to one terminal of a capacitor 61, which the other terminal thereof is connected to the junction between a diode 62 and the collector electrode of a NPN transistor 63 that constitutes a variable current source. The electrode of the diode 62 is connected to the stabilized source. The emitter electrode of transistor 63 is connected to pad 11c, while the base electrode is connected to receive a control voltage from an external AC negtive feedback quantity control device 20 via pad 11d of the monolithic integrated circuit.

Denoting the resistance of the load resistor 32 by R6, and that of the DC negative feedback resistor 33 by $R_E$, the gain G of the amplifier circuit is expressed by the following equation (3)

$$G = \frac{R_L}{R_E/Z} \quad (3)$$

where Z represents the impedance of the AC negative feedback circuit expressed by equation (2). The parallel impedance RE and the impedance Z of the denominator provide the frequency characteristic shown in FIGS. 31 and 32. Consequently, the frequency characteristic of the gain G becomes the reciprocal of the impedance of the denominator, that is the peaking characteristic. As has been described in relation with FIGS. 31 and 32, according to this characteristic, the frequency at which the peaking begins can be set by the setting of $C_P$ independently of the DC bias characteristic. Moreover, the amount of peaking can be freely adjusted independently of the DC bias characteristic and the peaking initiation frequency by the current $I_D$.

FIG. 34 shows one example of application of the AC negative feedback circuit shown in FIG. 26 to a differential by be high frequency amplifier circuit. In FIG. 34, circuit elements, corresponding to those shown in FIG. 30 are designated by the same reference charactors added with suffixes A and B. In FIG. 34 there is added a current source 35 connected between the junction between the emitter resistors 33A and 33B and the pad 11c. In this embodiment two sets of elements constituting the AC negative feedback circuit shown in FIG. 30 are used which are respectively connected to the emitter electrodes of transistors 31A and 31B. The base electrodes of transistors 63A and 63B acting as variable current sources are commonly connected to the external control device 20 via pad 11$_d$.

With this construction too, the peaking characteristic of the high freequency amplifier circuit can be adjusted as desired by proper selection of the capacitances of capacitor 61A and 61B, and by controlling R$_D$ through an external terminal.

As above described, it is possible to adjust the impedance by using a capacitor and the differentiated resistance of a diode and by varying the current bias condition of this diode. Especially, in a peaking amplifier circuit, the peaking initiation frequency and the degree of peaking can be adjusted or set independently. Thus, it is possible to readily adjust the degree of peaking through an external terminal by setting the value of the capacitor starting from a desired peaking initiation point. Consequently, even when the value of such element as an integrated circuit is difficult to correct, the degree of peaking can be adjusted by observing the characteristic, thus obtaining a stable amplifier characteristic. This improve, the yield and decreases the manufacturing cost so that the frequency band can be widened as far as possible.

It should be understood that this invention is not limited to the specific embodiments described above and that many variations and modifications can be made without departing the spirit of the invention. For example, the transistor comprising the amplifier of the high frequency amplifier circuit may be of PNP type instead of NPN type. Furthermore, the amplifier may be constituted by multi-stage transistors. Although in FIG. 1, a stabilized source circuit is formed on a semiconductor integrated circuit substrate . . . , this is not material to this invention. If the voltage source supplied is sufficiently stabilized an independent stabilized source can be omitted. The stabilized source circuit may be formed on the outside of the substrate.

In the illustrated embodiments the control device was formed independently of the integrated circuit incorporated with an amplifier, but a portion of the control device, for example a temperature characteristic compensation circuit, may be incorporated into the integrated circuit including the amplifier, while a control element such as a variable resistor may be formed on the outside.

In addition, it should be appreciated that the diode can be obtained from a transistor by connecting its base and collector or alternatively by floating it collector so that a junction between the base and emitter takes part in the diode function.

What is claimed is:

1. A monolithic integrated circuit device including an AC negative feedback type high frequency amplifier circuit comprising:
   a substrate on which said monolithic integrated circuit device is formed; and
   an AC negative feedback circuit for said high frequency amplifier circuit including a semiconductor impedance element having a junction capacitance of a diode supplied with a reverse bias voltage and connected to an external terminal on said substrate, which is connected to a variable control means for adjusting an amount of AC feedback of said high frequency amplifier circuit.

2. The monolithic integrated circuit device according to claim 1 wherein said high frequency amplifier circuit comprises a transistor with its base electrode supplied with an input signal, a load resistor connected between a first source of reference voltage and a collector electrode of said transistor, a DC negative feedback resistor connected between a second source of reference voltage and an emitter electrode of said transistor and a diode constituting said AC negative feedback circuit, one end of said diode being connected to the emitter electrode of said transistor and the other end of said diode being connected to said variable control means through said external terminal.

3. The monolithic integrated circuit device according to claim 1 wherein said high frequency amplifier circuit comprises:
   two sets of serially connected members, each including a load resistor, a transistor and a DC negative feedback resistor;
   a current source commonly connected to one ends of respective DC negative feedback resistors; and
   two diodes with one ends being connected to respective emitter electrodes of said transistors, the other ends of the diodes being commonly connected to said variable control means through said external terminal.

4. The monolithic integrated circuit device according to claim 1 wherein said diode is connected to said high frequency amplifier circuit via a capacitor for interrupting direct current.

5. The monolithic integrated circuit device according to claim 5 which further comprises a resistor connected between a juncture between said diode and said capacitor and said external terminal.

6. The monolithic integrated circuit device according to claim 5 wherein said high frequency amplifier circuit comprises:
   a transistor having base, collector and emitter electrodes;
   means for applying an input signal to said base electrode;
   a load resistor connected between a first source of reference voltage and the collector electrode of said transistor;
   and a DC negative feedback resistor connected between a second source of reference voltage and said emitter electrode, and wherein said capacitor for interrupting direct current is connected to said emitter electrode, and the other end of said diode is connected to said second source of reference voltage.

7. The monolithic integrated circuit device according to claim 5 wherein said high frequency amplifier circuit comprises;
   two sets of serially connected members, each comprising a load resistor, a transistor and a DC negative feedback resistor; and
   a current source connected between commonly connected one ends of respective DC negative feedback resistors and a second source of reference voltage,
   and wherein said AC negative feedback circuit comprises two sets each including a capacitor for interrupting direct current, a diode and a resistor, one ends of different DC interrupting capacitors are connected to emitter electrodes of said transistors, and one ends of said diodes are commonly connected to said second source of reference voltage.

8. The monolithic integrated circuit device according to claim 1 wherein said semiconductor impedance element comprises a diffusion capacity between base and emitter electrodes of a transistor.

9. The monolithic integrated circuit device according to claim 1 wherein said semiconductor impedance element comprises a diffusion capacitance between base and collector electrodes of a transistor.

10. The monolithic integrated circuit device according to claim 1 wherein said AC negative feedback circuit comprises:
   first and second transistors each having a plurality of output electrodes and a base electrode; and
   a variable current source,
   one output electrodes of said first and second transistors are commonly connected to a first source of reference voltage,
   the output electrodes of said first and second transistors are commonly connected to said variable current source,
   said variable current source is connected to said external terminal connected to said variable control means,
   the base electrode of said first transistor is connected to said high frequency circuit,
   a bias source is connected to the base electrode of said second transistor such that the same operates as a base grounded type, and wherein said semiconductor impedance element is constituted by a diffusion capacitances between base and emitter electrodes of said first and second transistors.

11. The monolithic integrated circuit device according to claim 10 wherein said variable current source is constituted by a transistor.

12. The monolithic integrated circuit device according to claim 1 wherein said AC negative feedback circuit comprises:
   first and second transistors each having a plurality of output electrodes and a base electrode,
   one output electrodes of said first and second electrodes are commonly connected to a first source of reference voltage, the other output electrodes of said first and second transistors are commonly connected to a variable current source,
   said variable current source is connected to said external terminal connected to said variable control means,
   the base electrode of said first transistor is connected to said high frequency circuit,
   a bias source is connected to the base electrode of said second transistor such that the same operates as a base grounded type,
   and wherein said semiconductor impedance element is constituted by diffusion capacitances of the base and collector electrodes of said first and second transistors.

13. The monolithic integrated circuit device according to claim 11 wherein said variable current source comprises a transistor.

14. The monolithic integrated circuit device according to claim 1 wherein said AC negative feedback circuit comprises:
   first and second transistors each having a plurality of output electrodes and a base electrode; and
   a current source,
   one output electrodes of the first and second transistors are commonly connected to a source of reference voltage,
   the other output electrodes of the first and second transistors are commonly connected to said current source,
   the base electrode of said first transistor is connected to a high frequency circuit,
   the base electrode of said second transistor is connected to said external terminal connected to said variable control means, and
   said semiconductor impedance element is constituted by diffusion capacitances between base and emitter electrodes of said first and second transistors.

15. The monolithic integrated circuit device according to claim 14 wherein said current source is constituted by a transistor.

16. The monolithic integrated circuit device according to claim 1 wherein said AC negative feedback circuit comprises:
   first and second transistors each having a plurality of output electrodes and a base electrode; and
   a current source,
   one output electrodes of the first and second transistors are commonly connected to a source of reference voltage,
   the other output electrodes of said first and second transistors are commonly connected to a current source,
   the base electrode of said first transistor is connected to a high frequency circuit,
   the base electrode of said second transistor is connected to said external terminal connected to said variable control means, and
   said semiconductor impedance means is constituted by diffusion capacitances between base and collector electrodes of said first and second transistors.

17. The monolithic integrated circuit according to claim 1 wherein said AC negative feedback circuit includes:
   first and second transistors and
   a resistor,
   an output electrode of said first transistor and said resistor which are connected in series between first and second voltage sources, a base electrode of said first transistor is connected to a high frequency circuit, an output electrode of said second transistor is connected in parallel with said resistor, and a base electrode of said second transistor is connected to said external terminal connected to said variable control means.

18. The monolithic integrated circuit device according to claim 8 wherein said high frequency amplifier circuit comprises:
   two sets of serially connected members each set including a load resistor, a transistor and a DC negative feedback resistor; and
   a current source connected between a junction between respective DC negative feedback resistors and a second source of reference voltage,
   and wherein said AC negative feedback circuit comprises:
   first and second transistors each having a plurality of output electrodes, and
   a variable current source,
   one output electrodes of said first and second transistors are commonly connected to a first source of reference voltage,
   the other output electrodes of said first and second transistors are commonly connected to a variable current source which is connected to said external terminal connected to said variable control means, and base electrodes of said first and second transistors are connected between said transistor of said high frequency amplifier circuit and said DC negative feedback resistor.

19. The monolithic integrated circuit device acccording to claim 18 wherein said variable current source comprises a transistor.

20. The monolithic integrated circuit device according to claim 9 wherein said high frequency amplifier circuit comprises:
two sets of serially connected members each set including a load resistor, a transistor and a DC negative feedback resistor; and
a current source connected between a junction between respective DC negative feedback resistors and a second source of reference voltage,
and wherein said AC negative feedback circuit comprises:
first and second transistors each having a plurality of output electrodes and a base electrode; and a variable current source,
one output electrodes of said first and second transistors are commonly connected to a first source of reference voltage, the other output electrodes of said first and second of transistors are commonly connected to said variable current source which is connected to said external terminal connected to said variable control means, and
the base electrodes of said first and second transistors are connected between the transistor of said high frequency amplifier circuit and said DC negative feedback resistor.

21. The monolithic integrated circuit device according to claim 20 wherein said variable current source comprises a transistor.

22. The monolithic integrated circuit device according to claim 21 wherein said AC negative feedback circuit comprises: a diode and a variable current source which are connected in series between first and second voltage sources; and
a capacitor with one and connected to a junction between said diode and said variable current source and the other and connected to said high frequency amplifier circuit, and wherein said variable current source is connected to said external terminal connected to said variable control device.

23. The monolithic integrated circuit device according to claim 22 wherein said high frequency amplifier circuit comprises:
a transistor including base collector and emitter electrodes;
means for applying an input signal to said base electrode;
a load resistor connected between said first source of reference voltage and said collector electrode; and
a DC negative feedback resistor connected between a second source of reference voltage and said emitter electrode,
and wherein said capacitor in said AC negative feedback circuit is connected to said emitter electrode.

24. The monolithic integrated circuit device according to claim 23 wherein said high frequency amplifier circuit comprises:
two sets of serially connected members each including a load resistor, a transistor and a DC negative feedback resistor;
a current source conducted between commonly connected one ends of respective DC negative feedback resistors and second source of reference voltage,
and wherein said AC negative feedback circuit comprises:
first and second capacitors;
first and second diodes; and
first and second variable current sources,
said first diode, said first variable current source and said second diode are connected in series between a first source of reference voltage and said second voltage source, one ends of said first and second capacitors are connected to the junctions between said first and second diodes and between said first and second variable current sources respectively,
the other ends of said first and second capacitors are connected to junctions between said transistors and said DC negative feedback resistors respectively, and
said first and second variable current source are commonly connected to said external terminal connected to said variable control means.

25. A monolithic integrated circuit device including an AC negative feedback type high frequency amplifier circuit comprising:
a substrate on which said monolithic integrated circuit device is formed; and
an AC negative feedback circuit for said high frequency amplifier circuit including a semiconductor impedance element, wherein said element is a capacitance between a base region of the element and a region neighboring the base region and connected to an external terminal on said substrate, which is connected to a variable control means for adjusting an amount of AC feedback of said high frequency amplifier circuit.

26. A monolithic integrated circuit device including an AC negative feedback type high frequency amplifier circuit comprising:
a substrate on which said monolithic integrated circuit device is formed; and
an AC negative feedback circuit for said high frequency amplifier circuit including a semiconductor impedance element, wherein said element is a differentiated resistance of a diode, connected to an external terminal on said substrate, which is connected to a variable control means for adjusting an amount of AC feedback of said high frequency amplifier circuit.

* * * * *